United States Patent [19]

Helfrick

[11] Patent Number: 5,278,571
[45] Date of Patent: Jan. 11, 1994

[54] RF COUPLER FOR MEASURING RF PARAMETERS IN THE NEAR-FIELD

[75] Inventor: Albert D. Helfrick, Kinnelon, N.J.

[73] Assignee: Tel Instrument Electronics Corp., Carlstadt, N.J.

[21] Appl. No.: 777,629

[22] Filed: Oct. 16, 1991

[51] Int. Cl.⁵ ............................................. G01R 29/08
[52] U.S. Cl. ...................................... 343/703; 343/705
[58] Field of Search ............... 343/703, 705, 708, 873, 343/895; 455/226.1, 67.1

[56] References Cited

U.S. PATENT DOCUMENTS

| | | | |
|---|---|---|---|
| 2,490,782 | 4/1946 | Collup | 343/703 |
| 3,641,439 | 2/1972 | Asian | 325/363 |
| 3,760,271 | 9/1973 | Bach, Jr. et al. | 343/703 |
| 4,134,119 | 1/1979 | Sandoz et al. | 343/703 |
| 4,453,164 | 6/1984 | Patton | 343/360 |
| 4,468,669 | 8/1984 | Wang et al. | 343/703 |
| 4,588,993 | 5/1986 | Babij et al. | 343/703 |
| 4,704,614 | 11/1987 | Poirier et al. | 343/703 |
| 5,001,494 | 3/1991 | Dorman et al. | 343/703 |
| 5,016,020 | 5/1991 | Simpson | 343/703 |

OTHER PUBLICATIONS

Kunath et al, "Near-Field Antenna Testing Using the Hewlett Packard 8510 Automated Network Analyzer", Paper, Antenna Measurement Techniques Assoc. Meeting, Philadelphia, PA, NASA, 9pp, (8-11 Oct. 1990).
R. I. Gray, "Measurement of Antenna Near Fields", technical memorandum No. W-7/67, AD849027, Weapons Development Evaluation Lab., U.S. Naval Weapons Lab., Dahlgren, VA, 7pp, (Mar. 1967).
Hanfling, "Planar Near Field Measurements for Aircraft Antenna Applications", Raytheon Co., Bedford, Mass., 1979 Antenna Applications Symposium, Univ. of Illinois and Electromagnetic Sciences Div. of RADC, Hanscom AFB at Allerton Park, Monticello, Ill., (26-28 Sep. 1979).

*Primary Examiner*—Donald Hajec
*Assistant Examiner*—Tan Ho
*Attorney, Agent, or Firm*—Nixon & Vanderhye

[57] ABSTRACT

An RF coupler is used to measure transmitted power and receiver sensitivity of an avionics RF transceiving system (e.g., a secondary radar transponder). The coupler physically mates with (e.g., by conformally enveloping) an airborne type blade antenna mounted to the fuselage of an aircraft. The construction and theory of operation of such a coupling device for coupling RF energy into an antenna is disclosed. The coupling device provides receiver sensitivity measurements and produces rectified pulses or DC levels for the purpose of measuring transmitter power. The system measures such parameters in the extreme near-field (e.g., about 0.1 wavelength) to simplify the measurements and to isolate the measurements from errors due to standing waves and the presence of other nearby objects.

24 Claims, 7 Drawing Sheets

FIG. 7
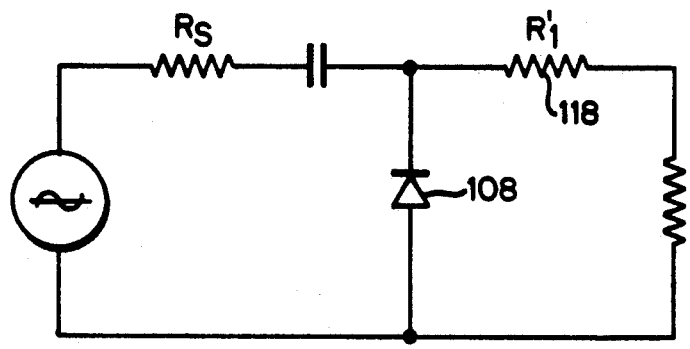
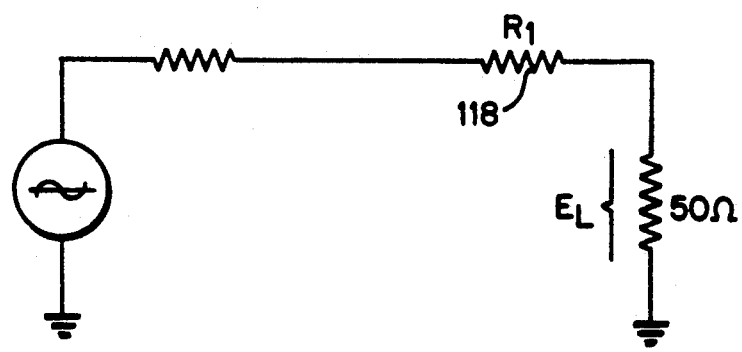
FIG. 8

RF COUPLER FOR MEASURING RF PARAMETERS IN THE NEAR-FIELD

FIELD OF THE INVENTION

The present invention relates to measuring the performance characteristics of a RF transceiving system, and more particularly, to techniques for measuring RF receiver sensitivity and radiated transmitter power in the near-field. Still more particularly, the present invention relates to an inexpensive, easy-to-use probe and associated test set which provides relatively accurate measurements of the characteristics of an airborne fuselage-mounted RF antenna and associated RF transceiving system.

BACKGROUND AND SUMMARY OF THE INVENTION

It is necessary to periodically measure the operating characteristics of airborne RF transceiving systems (e.g., secondary radar transponders) to facilitate adjustments and to ensure that they are operating properly. Unfortunately, it is typically time consuming, difficult and complicated to remove such a system from the aircraft for testing purposes—and in any event it is desirable to test the entire system as installed on the aircraft (including the antenna and associated RF cabling and connections). Accordingly, for these and other reasons it is generally desirable or necessary to make measurements such as receiver sensitivity and transmitted power with the system in place on the aircraft.

In the past it has been difficult to accurately measure such parameters of avionics RF transceiving systems while the systems are installed on the aircraft. Extraneous objects (e.g., wings and other structures on and off the aircraft) make such "in place" measurements difficult and inaccurate. For example, measurement difficulties arise due to RF field perturbations in the vicinity of the airborne antenna. Pick-up antennas have in the past been positioned within a few wavelengths of the airborne antenna of the system under test in order to couple RF power to and from the system. However, measurements made in this way are subject to errors due to near-field effects and standing waves caused by other objects within a few wavelengths of the pick-up antenna and/or the airborne antenna.

To alleviate this problem, pick-up antennas have sometimes been placed far away (e.g., thirty or more wavelengths) from the airborne antenna. At these distances, however, the reduced power levels of the received signals become troublesome. In addition, it is more difficult to assure at such large distances that the pickup antenna is located a predetermined distance from the airborne antenna (the accuracy in positioning the pickup antenna directly determines the accuracy of the resulting measurements in most cases).

Much prior work and analysis has been done in regard to the use of near-field measurements of avionics type and other RF radiators for ascertaining various antenna characterstics (e.g., radiation patterns). The following is a non-exhaustive listing of prior publications and patents relating to some such prior work:

U.S. Pat. No. 4,468,669 to Wang et al;
U.S. Pat. No. 3,760,271 to Bach, Jr. et al;
U.S. Pat. No. 3,641,439 to Asian;
U.S. Pat. No. 4,588,993 to Babij et al;
U.S. Pat. No. 4,704,614 to Poirier et al;
U.S. Pat. No. 4,453,164 to Patton;
U.S. Pat. No. 5,001,494 to Dorman et al;
Kunath et al, "Near-Field Antenna Testing Using the Hewlett Packard 8510 Automated Network Analyzer", Paper, Antenna Measurement Techniques Assoc. Meeting, Philadelphia, Pa., NASA, 9 pp, (8–11 October 1990);
R. I. Gray, "Measurement of Antenna Near-Fields", technical memorandum no. W-7/67, AD849027, Weapons Development Evaluation Lab., U.S. Naval Weapons Lab., Dahlgren Va., 7 pp, (March 1967); and
Hanfling, "Planar Near-Field Measurements for Aircraft Antenna Applications", Raytheon Co., Bedford, Mass., 1979 Antenna Applications Symposium, Univ. of Illinois and Electromagnetic Sciences Div. of RADC, Hanscom, AFB at Allerton Park, Monticello, Ill., (26–28 September 1979).

The Hanfling et al. reference discusses, beginning at page 6, the difficulties of far field testing of installed airborne RF systems, and discloses a complicated technique using inverse Fourier transformations to measure the radiation pattern of a fuselage mounted broadbeam avionics antenna. However, it appears that a complicated x-y-z type rotating arm sensor shown in Hanfling's FIG. 12 would be required to obtain the data needed to perform such an analysis.

Wang et al. teaches a twin lead transmission line RF source for making near-field sensitivity measurements of a phased array type radar antenna.

Gray teaches a circular loop probe for measuring the levels of E and H fields in the near-field to provide measurements relating to hazards of electromagnetic radiation to ordnance.

Kunath et al. teach near-field testing of a large microwave radar antenna using an automated network analyzer connected to a probe (see FIG. 1).

Bach, Jr. et al. and Asian teach various non-antenna type probes for measuring power density in the near-field. However, such probes (e.g., diode arrays and thermocouples) would not be useful for measuring RF receiver sensitivity and have other problems as well.

Babij et al., Poirier et al., Patton and Dorman et al. teach additional complicated arrangements for mapping the radiation pattern of antennas based on near-field measurements.

There may be representative teachings in the prior art in addition to the references cited above. For example, it is generally known to place a small sensing antenna or probe a small distance from a radiating antenna for determining, for example, whether or not the radiating antenna is radiating a signal and for monitoring such radiated signal. Additionally, a manufacturer of military antennas several years ago advertised an antenna assembly including a probe disposed integrally within the antenna assembly itself. The advertised antenna assembly had two connectors: one for coupling RF energy to/from the antenna; and the other for connection to the probe. The probe may have been used for monitoring characteristics relating to the radiated output power of the antenna.

While much work has been done in the past relating to near-field measurements of RF transceiving systems, certain major problems have not been solved. For example, near-field measurements in the past have been costly and complicated. No simple, inexpensive device or system has been readily available in the past to provide accurate near-field measurements of certain parameters (e.g., radiated power level; and RF receiver sensitivity) of great importance to the testing of installed avionics RF systems. In addition, prior near-field measuring techniques required great attention and skill in order to provide accurate results. It would be highly desirable to provide a measuring technique that could provide accurate, repeatable results when performed by relatively unskilled technicians.

The present invention solves these and other problems inherent in prior art approaches by providing a low-cost RF probe and associated system that can be used for quickly, easily and relatively accurately measuring the transmitter radiated power and receiver sensitivity of an RF transceiving system (e.g., of the type mounted on the fuselage of an aircraft) while avoiding the standing wave and other troublesome effects encountered using past near-field antenna testing techniques.

In accordance with one aspect of the present invention, a coupling device is provided that makes use of the very close near-field at a distance so small that standing waves and the perturbations of nearby objects have very little effect on the measurements. For example, the near-field is used for measuring the sensitivity of the system by placing the signal injection so close to the antenna of the system under test that disturbances from objects in the far and intermediate fields have very little effect on the coefficient of coupling.

In accordance with another aspect of the present invention, the probe is placed so close to the antenna under test (e.g., 0.1 wavelengths away) that substantially only the tangential E field (and substantially no H field or radial E field) is coupled between the probe and the antenna. Measurements are simplified by the ability to ignore the effects of the H field and the radial E field.

In accordance with yet another feature provided by the present invention, a probe assembly is provided which is capable of mating with an antenna structure (e.g., the airborne blade type antenna of a secondary radar transponder antenna of the type that may be found on the fuselage of some aircraft). Such mating is providing by structure which conformally envelopes at least a portion of the antenna. By so mating the probe assembly with the antenna under test, a predetermined near-field spacing and alignment is accurately provided between a short RF pickup element contained within the probe assembly and the antenna under test. Measurements can thus be performed rapidly and accurately by a relatively unskilled technician—avoiding the need for complicated calibration procedures and equipment.

BRIEF DESCRIPTION OF THE DRAWINGS

These and other features and advantages of the present invention will be better and more completely understood by referring to the following detailed description of a presently preferred exemplary embodiment in conjunction with the drawings, of which:

FIGS. 7 and 8 are schematic diagrams of equivalent circuits for the FIG. 6 arrangement under different diode conduction conditions (not conducting and conducting, respectively).

DETAILED DESCRIPTION OF A PRESENTLY PREFERRED EXEMPLARY EMBODIMENT

Figure 1:
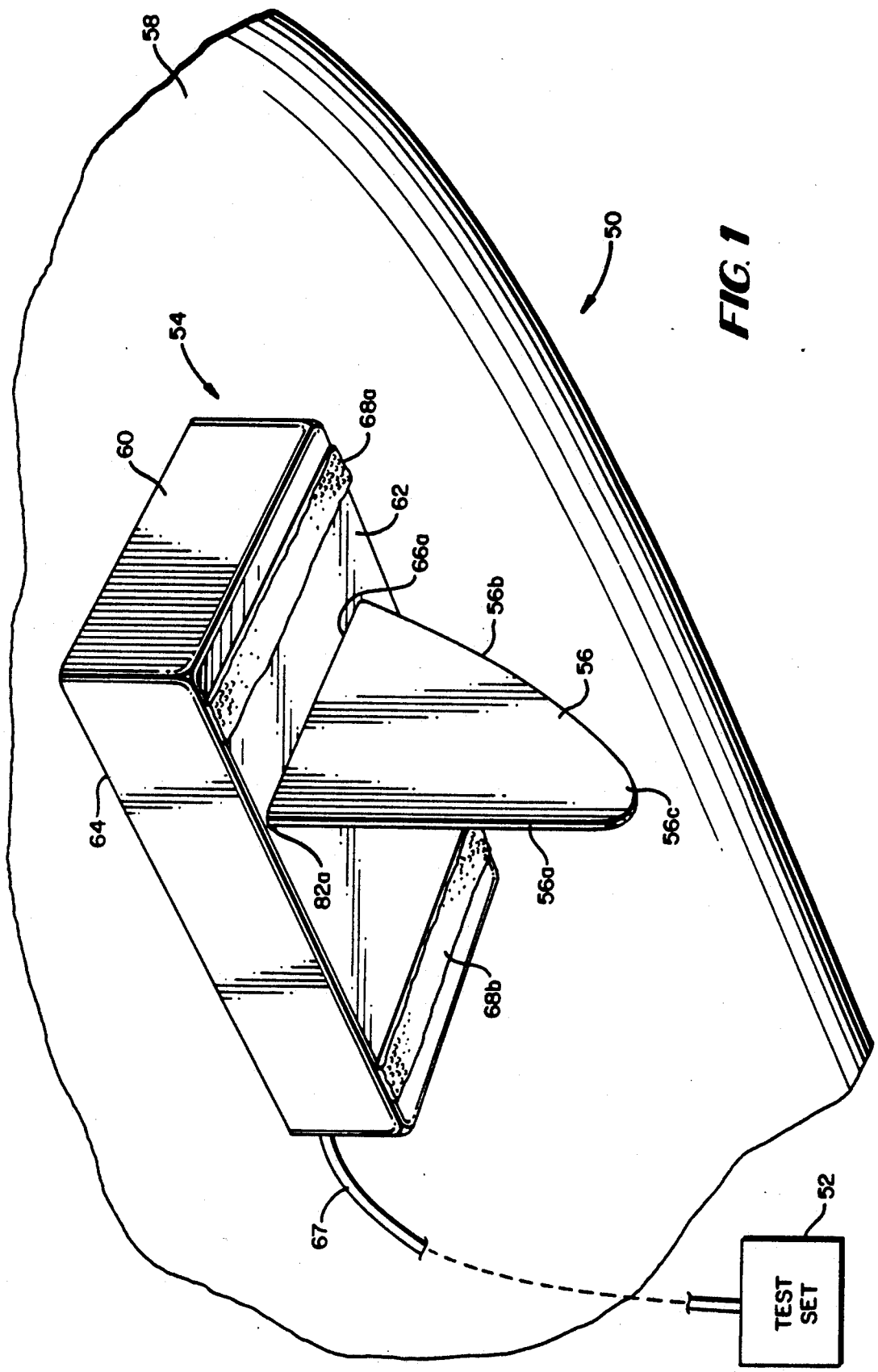
FIG. 1 is an elevated perspective view showing a preferred embodiment RF measuring system including a probe assembly mated with a fuselage-mounted airborne blade type RF antenna.

FIG. 1 is an elevated view in perspective of a presently preferred exemplary embodiment of an RF testing system 50 provided by the present invention. System 50 includes an RF test set 52 and a test coupler or probe assembly (hereafter "probe") 54. Test set 52 is preferably a conventional testing device designed to be coupled to an RF antenna under test via an RF coupler. Test set 52 may be capable of measuring RF carrier frequency; and preferably is also capable of measuring RF radiated output power level (e.g., in response to a DC level provided by the RF coupler). Test set 52 is also capable of providing a low power RF signal at calibrated level and frequency for use in measuring RF receiver sensitivity. Test set 52 may suitably comprise, for example, a model T-48 Test Set sold by Tel-Instrument Electronics Corp. (the assignee of the subject application).

FIG. 1 shows probe 54 mated with a blade type antenna 56. Blade antenna 56 may be mounted on the fuselage 58 of an aircraft (e.g., extending downward from the underside of the aircraft fuselage), for example, and is of the type and configuration that is commonly used in avionics secondary radar transponder systems. Thus, blade antenna 56 is coupled to an RF transceiving system (not shown) installed on board the aircraft, and is used to transmit and receive RF signals. As can be seen in FIG. 1, blade antenna 56 comprises a relatively thin, tapered structure having a relatively straight edge 56a and an opposite curved edge 56b. Antenna 56 is dimensioned such that it radiates at predetermined frequency or range of useful frequencies (e.g., in the 4000 MHz region of the RF spectrum). The length of antenna 56 shown in FIG. 1 is exemplary; the actual length of the antenna depends on operating frequency and may be shorter (or longer) than that shown.

Probe 54 in the preferred embodiment includes a rectangular housing 60 having a top surface 62 and a bottom surface 64. A top slot 66a is cut through the top surface 62, and a bottom slot 66b (not shown in FIG. 1) is cut through the bottom surface 64. The two slots 66a, 66b are aligned with one another with respect to housing 62 (as will be explained in connection with FIG. 2) such that the housing can be slided over blade antenna 56—with the blade antenna penetrating into and through probe housing 60 (through slots 66a, 66b) so as to protrude (through slot 66a) out of the housing top surface 62. Probe 54 is removable from antenna 56, and is slided over the antenna only during testing of antenna 56 and its associated RF transceiver system. A coaxial cable 67 terminating in a connector (not shown) is used to connect probe 54 to test set 52.

Figure 2:
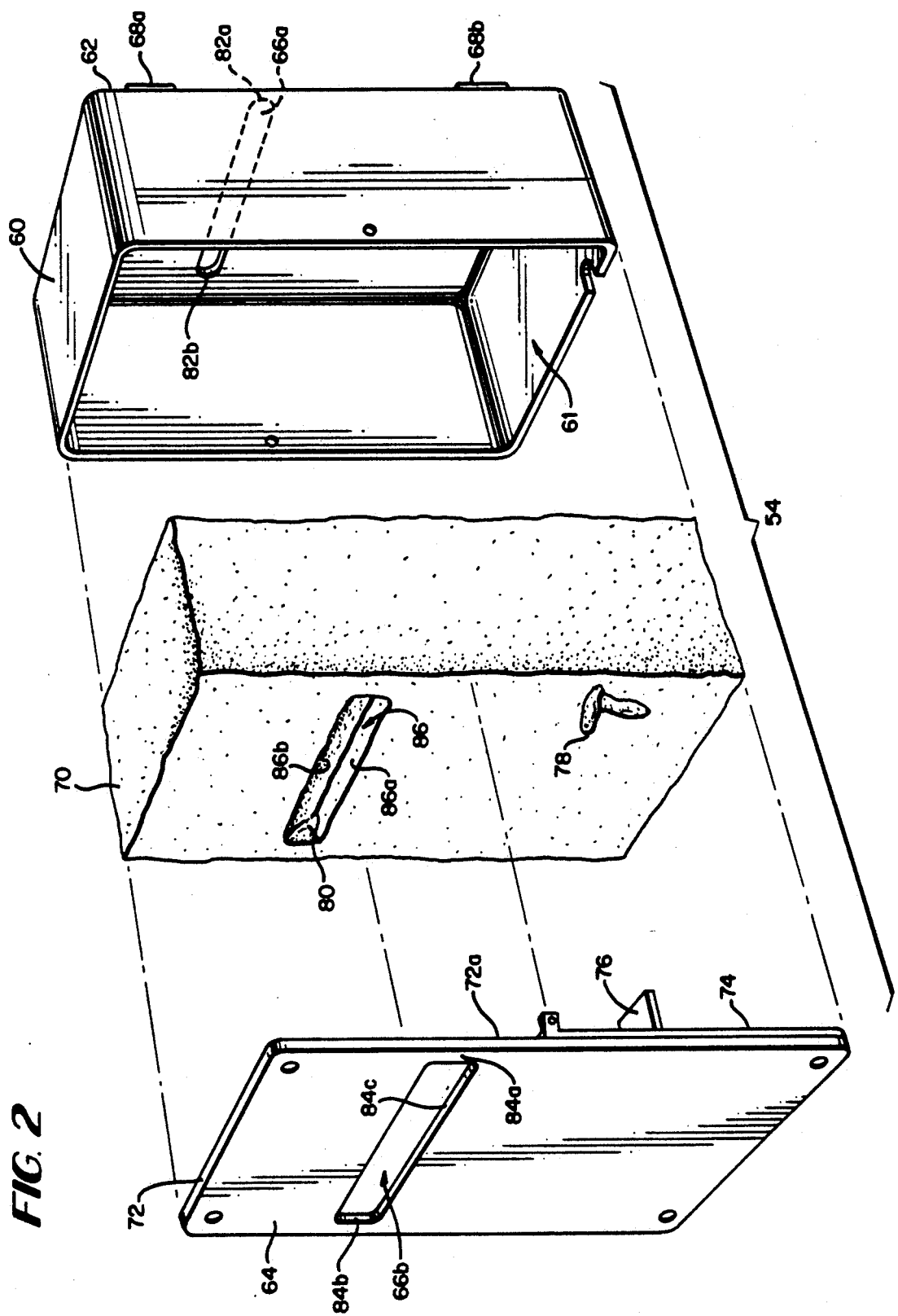
FIG. 2 is an exploded perspective view of the probe assembly shown in FIG. 1.
Figure 2A:
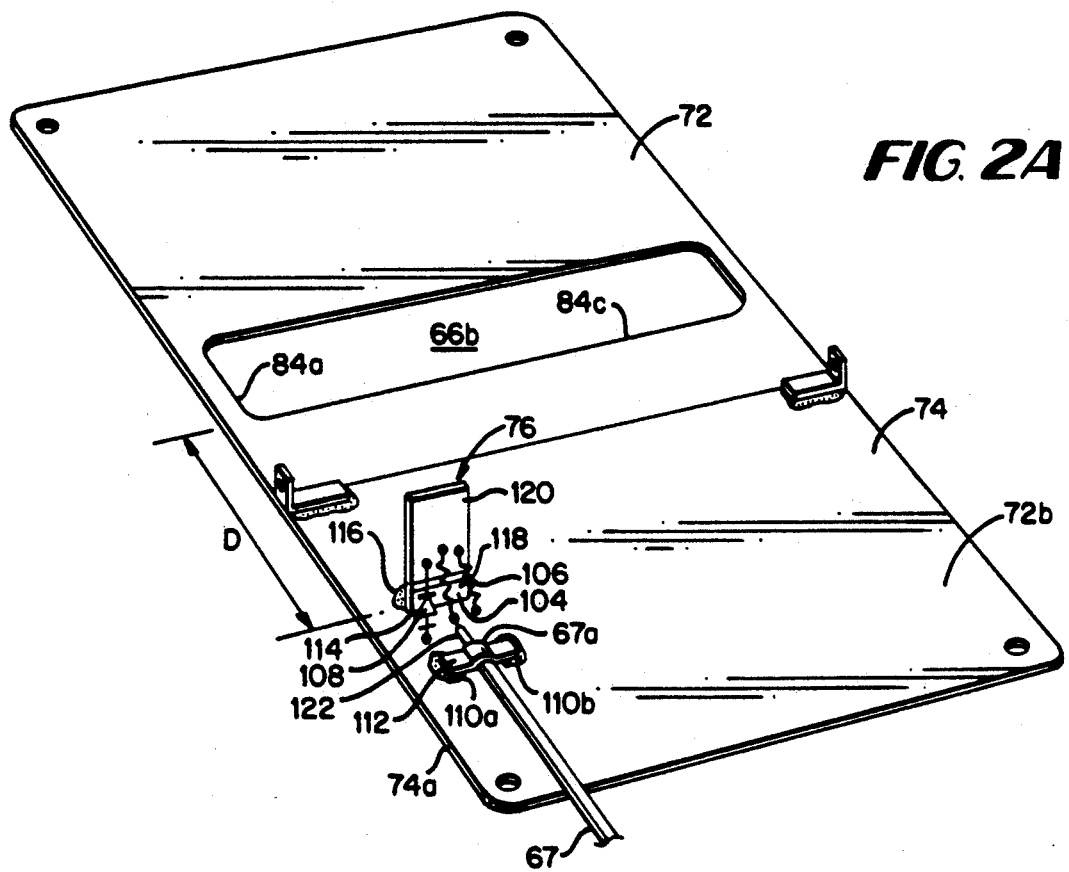
FIG. 2A is a perspective view of the rear plate shown in FIG. 2 showing the probe antenna assembly in more detail.
Figure 2B:
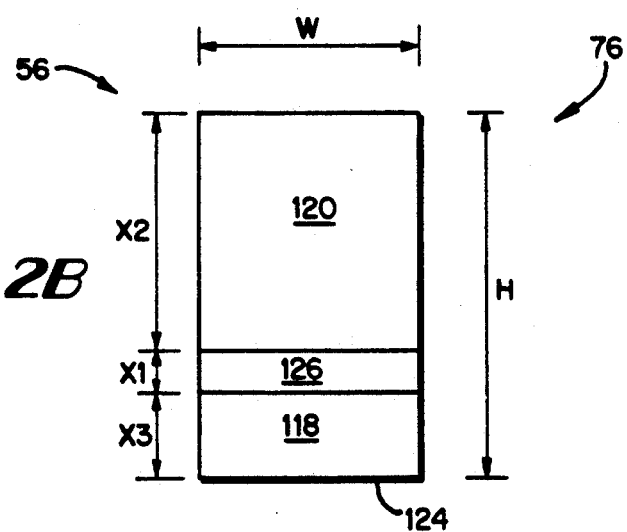
FIG. 2B is a plan view of the probe antenna element shown in FIG. 2A.
Figure 2C:
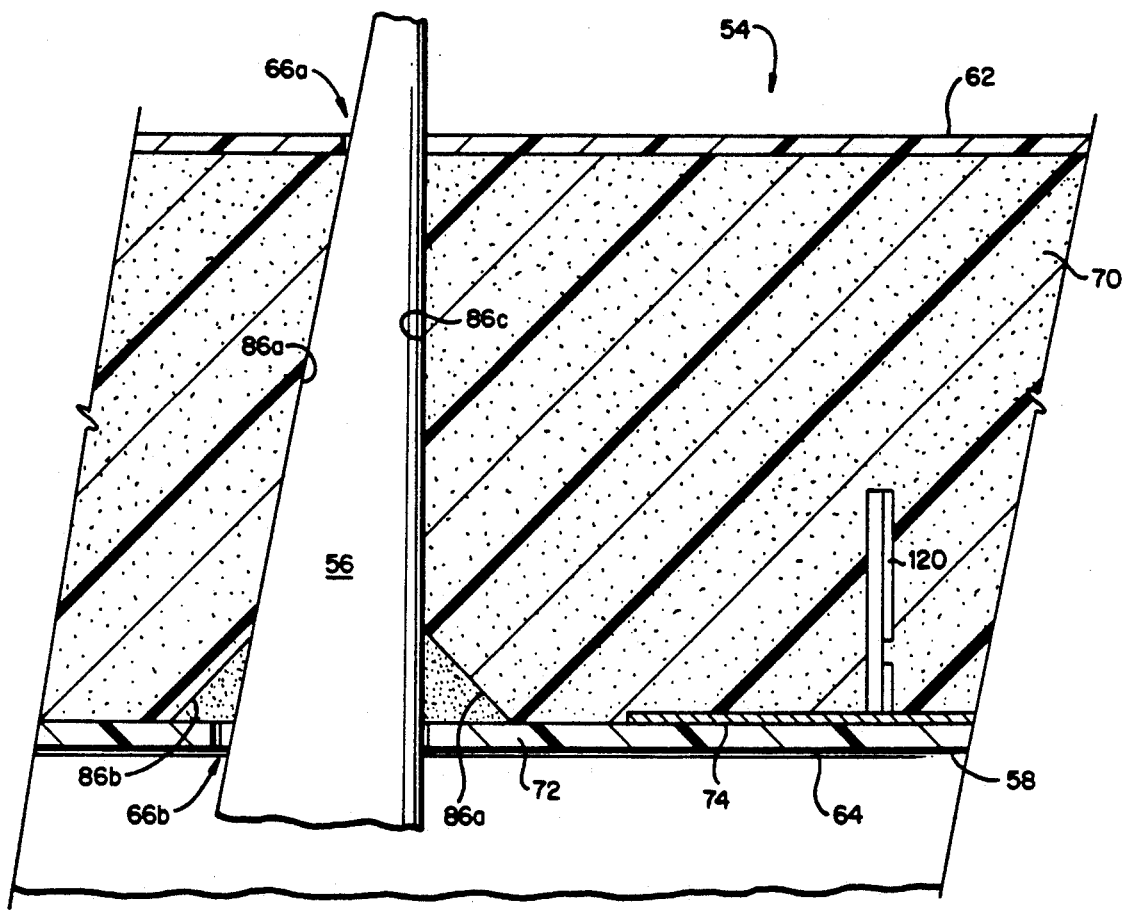
FIG. 2C is a side view in cross-section of the FIG. 2 probe mated with the blade antenna as shown in FIG. 1.

FIGS. 2-2C show in detail the structure of the presently preferred exemplary embodiment of probe 54. Referring to FIG. 2, probe 54 includes a hollow rectangular housing 60 (e.g., made out of plastic or other dielectric material) defining a cavity 61 therein. A dielectric foam block 70 substantially fills cavity 61. A board or plate 72 of dielectric material seals cavity 61, thus retaining foam block 70 within the housing 60. Plate 72 has an inner surface 72a a portion 72b of which is clad with a conductive (e.g., copper) cladding 74. A probe or pick-up antenna RF element 76 (hereafter "pickup element") mounted on the surface of cladding 74 protrudes into a cavity 78 defined within foam block 70. Pickup element 76 couples RF energy to and from blade antenna 56. Mounting screws (not shown) may be used to fasten board 72 to rectangular housing 60. In the preferred embodiment, housing top surface 62 is also provided with two velcro strips 68a, 68b (shown in FIG. 1) for use in storing probe 54 within the inside cover (not shown) of test set 52.

Cladding 74 in the preferred embodiment comprises a conventional copper cladding layer of the type typically used for single sided printed circuit board fabrication. Thus, in the preferred embodiment cladding layer 74 is bonded to dielectric plate 72; and cladding is removed (e.g., using an conventional chemical etching process) from all but portion 72b of the plate (as shown in FIG. 2A) such that the cladding is physically and electrically isolated from slot 66b. This cladding 72 provides an electrical and RF ground plane in the preferred embodiment (as will be explained in further detail shortly).

Pickup element 76 is mounted on cladding layer 72 (as can best be seen in FIG. 2A). In the preferred embodiment, pickup element 76 is spaced a predetermined distance D (e.g., 1-13/16 inches) away from slot 66b edge 84c and is disposed a predetermined distance (e.g., ⅜ inches) away from an edge 74a of board 72 (i.e., on the edge of the board nearest to bottom slot 66b edge 84a that contacts the blade antenna straight edge 56a. Various components (e.g., a diode 108 and adjusting resistors 104, 106) are soldered to the pickup element 76 and/or to the ground plane 74. The shield 67a of connecting coaxial cable 67 is also soldered to ground plane cladding 74 (e.g., using flowed solder 110 which establishes electrical and mechanical connections between a metallic cable retaining member 112 and the cladding).

In the preferred embodiment, conductive cladding 74 acts as a ground plane for pickup element 76. It is desirable that cladding 74 be oriented parallel and as close as possible to aircraft fuselage 58 (the fuselage acts as a ground plane for blade antenna 56). Accordingly, when mating probe assembly 54 to the blade antenna, the probe assembly should be pushed into close contact with the fuselage 58 such that the spacing between plate 72 and the fuselage is minimized.

In the preferred embodiment, pickup element 76 is rigidly mounted to cladding 74 using solder 114 and adhesive 116 such that it is perpendicular to the plane of cladding 76. In the preferred embodiment, an electrically conducting portion of pickup element 56 is electrically connected to cladding 74 via solder 114. Another electrically conducting portion 120 of pickup element 76 is electrically connected to the center conductor 122 of coaxial cable 67 via series resistor 104 (this resistor may be soldered directly between the pickup element and the center conductor); and electrically connected to cladding 74 via diode 108 and resistor 106. As will be explained, pickup element portion 120 comprises a short RF radiator that is dimensioned, spaced and oriented relative to blade antenna 56 so as to provide a desired degree of RF coupling.

FIG. 2B is a side view in plan of pickup element 56. In the preferred embodiment, pickup element 56 comprises a piece of copper cladded dielectric board 124 (e.g., single sided cladded board of the type conventionally used to make printed circuit boards). In the preferred embodiment, pickup element 56 has dimensions of W=7/16 inches wide and H=⅜ inches tall. The cladding is removed from a 1/16 inch (dimension "X1" shown in FIG. 2b) transverse strip 126 of the board 124 to provide isolation between portion 120 and portion 118. Portion 118 serves as a ground/mounting portion, and (as mentioned above) is mounted to cladding 74 using conductive flowed solder and flowed adhesive (e.g., of the type provided by a "glue gun"). Pickup element portion 120 serves as a radiating element in the preferred embodiment. Portion 120 in the preferred embodiment is substantially planar, has dimensions of W=7/16 inches by X2=⅜ inches (thus having a surface area of somewhat under one quarter square inches), and is oriented parallel to the blade antenna 56 under test (see FIG. 2C). Strip 126 electrically isolates radiating portion 120 from portion 118 and cladding 74.

As will be understood by those skilled in this art, the amount of RF coupling between probe 54 and blade antenna 56 is determined by the dimensions of pickup element radiating portion 120; and by the orientation and position of that radiating portion relative to the blade antenna 56 under test. The preferred embodiment probe 54 provides for stable and repeatable positioning of pickup element 76 relative to blade antenna 56. More specifically, probe 54 in the preferred embodiment includes structure that slips over and conformally envelopes blade antenna 56 in such a manner that pickup element 76 is positioned at a predetermined spacing and orientation relative to the blade antenna each time the probe is mated with the antenna.

As mentioned above, dielectric housing 60 filled with dielectric foam 70 has slots 66a, 66b machined on the two large faces of the box so that the avionics blade-type antenna may be inserted into (and through) the box. In somewhat more detail, the preferred embodiment provides a mounting/retaining arrangement (comprising bottom slot 66b, top slot 66a, and dielectric foam block 70 and a slot 80 cut therethrough) which defines a compressive contact structure. This compressive contact structure tightly envelopes blade antenna 56 such that probe 54 cannot move relative to the blade antenna once the two are mated—and also to provide, with high consistency and repeatability, accurate positioning and alignment of pickup element 76 relative to the blade antenna when the probe assembly 54 mates with the blade antenna.

More particularly, in the preferred embodiment, bottom slot 66b is cut through board 72, and top slot 66a is cut through housing top surface 62 such that when the board is assembled to the housing these slots are aligned with one another and with further slot 80 cut through foam block 70. In the preferred embodiment, slots 66a, 66b and 80 are dimensioned to closely conform with the outer dimensions of a lower portion of blade antenna 56 (i.e., the portion of the blade antenna nearest fuselage 58). For example, bottom slot 66b may be 3¼ inches long and ⅞ inches wide; top slot 66a may be 2⅛ inches long and ⅝ inches wide; and slot 80 may be approximately 3 inches long (block 70 is about 1¾ inches thick in the preferred embodiment). In the preferred embodiment, one end 82a of top slot 66a is aligned with a corresponding end 84a of bottom slot 66b. However, a further top slot end 82b is not aligned with a further bottom slot end 84b, but rather is displaced inwardly with respect to the position of the bottom slot end 84b such that the volume defined between the top and bottom slots conforms with the (tapered) outer dimensions of blade antenna 56. Slot edges 82a, 84a each closely contact the blade antenna straight surface 56a, and slot edges 82b, 84b each closely contact the blade antenna curved surface 56b, when the probe assembly 54 is mated with the blade antenna. In addition, the narrower top slot 66a is substantially centered within the width of wider bottom slot 66b, and foam block slot 80 is similarly centered.

Slot 80 formed in foam block 70 includes an approximately ¼ inch deep concavity 86 on the side of the foam block adjacent to bottom slot 66b (e.g., this concavity has slanted side surfaces 86a, 86b which guide the tip 56c of blade antenna 56 into the slot 80). No additional material is removed from the foam block 70 to define the remainder slot 80 therethrough in the preferred embodiment; rather, the foam is sliced without removing material from it to provide contacting opposing frictional walls 86c, 86d (see FIG. 2C). Dielectric foam block 70 is compressible, and thus, forcing the blade antenna through slot 80 causes the foam to tightly compress around the blade so as to very snugly retain the blade antenna within the foam slot. The compressive and frictional forces exerted by foam frictional walls 86c, 86d onto the outer surfaces of blade antenna 56 are sufficient to retain probe assembly 54 on the blade antenna once mated—even though blade antenna 56 is typically oriented downward towards the ground (see FIG. 1). In addition, the compressive forces exerted by foam block 80 onto the blade antenna 56 substantially prevent movement of probe assembly 54 relative to blade antenna while measurements are being made.

Thus, the relative registration (and absolute and relative dimensioning) of slots 66a, 66b and 80 provide a conformal, compressive structure that compressively envelopes blade antenna 56. This conformal structure also causes board 72 to be in a predetermined orientation relative to blade antenna 56 (e.g., nearly exactly perpendicularly to the blade antenna and substantially parallel to fuselage 58) when the blade antenna and the probe assembly 54 are mated. Referring to FIG. 2C, since board 72 is guaranteed to itself be substantially perpendicular to blade antenna 56 by the slotted conformal mounting system as described above, planar radiator portion 120 is oriented substantially parallel to blade antenna 56 when probe assembly 54 is mated with the blade antenna. In addition, the conformal mounting arrangement provided by slots 66a, 66b and 80 ensures that planar radiating portion 120 is spaced a predetermined distance from the surface of the blade antenna 56—and also ensures a predetermined orientation and spacing of this radiating portion with respect to the overall structure of the blade antenna. Moreover, such spacing and orientation is accurately provided on a repeatable basis (i.e., each time probe 54 is mated with blade antenna 56) so as to provide consistency in measurements without the necessity of a complex, time-consuming (and possibly error prone) distance/position calibration procedure. Housing 60 only covers the lower section of the antenna in the preferred embodiment (see FIGS. 2 and 2C) to reduce the amount of disturbance placed on the antenna under test.

The following steps are followed to use the preferred embodiment coupler 54 with test set 52 to simply and easily provide measurements of transmitter frequency, transmitter power output, and receiver sensitivity of an avionics secondary radar transponder RF system:

1. Open the cover of test set 52, (e.g., a Tel-Instrument T-48 test set), disengage the two black snap holders, and fold down the directional antenna.
2. Separate the Velcro-mounted probe housing 60 from the cover. Unwind the coupler cable 67 and the attached attenuator/connector (not shown).
3. Visually check the FORWARD-AFT orientation (preferably an arrow is provided on probe housing 60 to indicate the orientation of the probe with respect to the aircraft so as to ensure consistent alignment), and then slide the probe housing 60 over the transponder blade antenna 56. Make sure the probe housing bottom surface 64 (which may be indicated by screened information) is toward the aircraft fuselage surface 58; and that this housing bottom surface is in contact with the fuselage surface.
4. Connect the probe 60 attenuator/connector (not shown) to the test set 52 ANTENNA jack.
5. Using the Tel-Instrument T-48 test set "automatic interrogate" scenario to automatically read transmitter power, receiver sensitivity and transmitter frequency—and to display the results of such measurements on a data display window as the last three blocks of the automatic interrogate scenario.
6. At conclusion of measurements, slide the probe 54 off of antenna 56 and store back into test unit housing.

THEORY OF OPERATION

Figure 3:
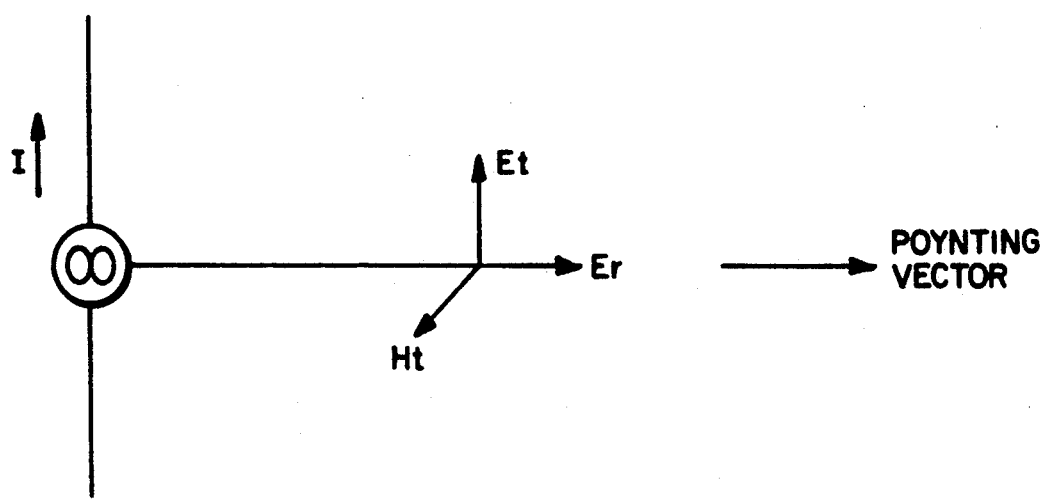
FIG. 3 is a graphical illustration of RF field components radiated by an exemplary RF radiator.

The radiation of an antenna has three components: the tangential electric field, $E_t$, the radial electric field, $E_r$ and the tangential magnetic field, $H_t$, as shown in FIG. 3.

At great distances from the radiator, for all practical matters, only the tangential electric and magnetic fields exist and, consequentially, produce a radial Poynting vector indicative of the outward flow of power.

At intermediate distances, that is between 0.5 and 10 wavelengths, all three fields are of significant magnitudes and the relationship between the radiating antenna and the pickup element is complex.

At very close distances, such as less than 0.1 wavelength, there is essentially no magnetic field. At the very base of the radiating antenna for a very short pickup element, the tangential field is considerably greater than the radial field and can be assumed to be the only term of the radiation equation.

For a very short distance, r, from a radiating dipole antenna, the magnitude of the tangential electric field due to a segment, dz carrying a current of I of that antenna is given by equation (1) below:

$$E_t = \frac{30\lambda I}{2\pi r^3} dZ$$

where $\lambda$ is the wavelength of the radiation, and I is the current in the radiating antenna as shown in FIG. 3.

Figure 4:
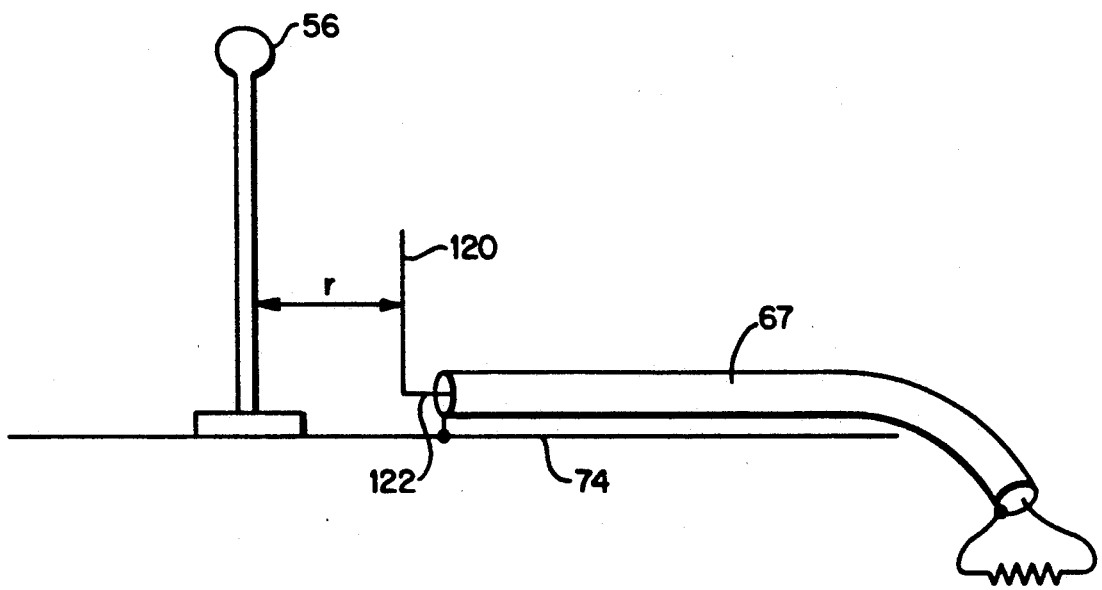
FIG. 4 is a schematic illustration of a quarter-wave monopole or equivalent antenna coupled to a short probe antenna or pickup element, the probe antenna being coupled to one end of a transmission line having a resistive load coupled to the other end thereof.

For the specific application of a secondary radar transponder, only a ¼ wave monopole or equivalent antenna will be used as a radiating element as shown in FIG. 4. In this case, the antenna impedance is typically 70 ohms and the radiator current will be replaced with the input power to the radiator. The monopole radiator on an infinite, or at least large, conducting ground plane is electrically equivalent to a half-wave dipole in space. Likewise, the pickup element on a ground plane is equivalent to a dipole in space.

Rewriting equation (1) for a half-wave antenna and substituting power for antenna current provides equation (2) below:

$$E_t = \frac{30\lambda \sqrt{\frac{P}{70}}}{2\pi r^3} dZ = 0.571 \frac{\lambda \sqrt{P}}{r^3} dZ$$

where P is the power to the radiating antenna.

For a very short pickup element in an electric field parallel to the axis of the antenna, the induced voltage at the antenna terminals, unterminated, is, simply (as expressed in equation (3) below)

$$E_t(s)$$

where s is the length of the pickup element.

Combining equations 2 and 3, the induced voltage at the of the pickup element as a function of input power into the radiating antenna provides the equation (4) expression below:

$$E = E_t s = \frac{0.571\lambda \sqrt{P}}{r^3} dZ$$

Since the pickup element is very short compared to a wavelength and is to be placed near the radiator, the voltage induced in the pickup element will be due to the current flowing in the adjacent length of the radiator. Therefore, for a first approximation the length s and dz will be considered the same.

Notice, that for a constant $\lambda$, s and r, the induced voltage at the base of the pickup element is proportional to the square root of the power input to the radiator.

Figure 5:
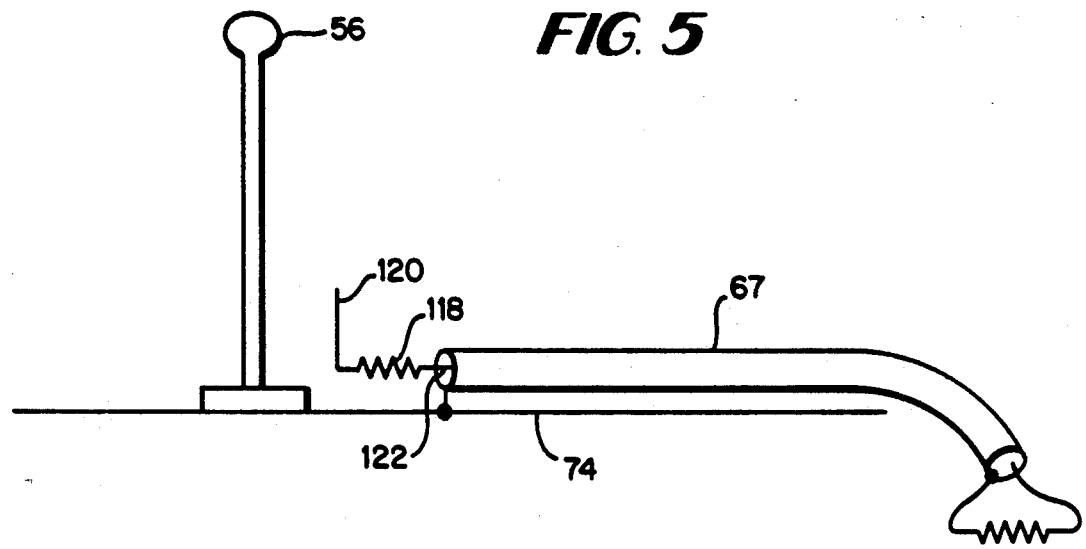
FIG. 5 is a schematic illustration of the FIG. 4 arrangement including an additional resistance in series with the short probe antenna.

Generally, the impedance of a very short monopole is quite low, that is compared to the normal RF operating impedances of 50 and 75 ohms. Therefore, it may safely be assumed that the open circuit voltage of the pickup element is nearly that of the pickup element terminated in the typical 50 ohm or greater device. In addition, a series resistor 118 may be added to adjust the attenuation of the antenna coupler as shown in FIG. 5.

Rewriting equation (4), the attenuation of the coupler unit may be given below in equation (5) as $$\frac{P_l}{P} = \frac{50 \ (0.571)^2 \lambda^2 s^4}{(R_1 + 50)^2 r^6}$$

where $P_l$ is the power to the 50 ohm load. Not the attenuation is only a function of the mechanical dimensions, the wavelength of the operating system and the value of $R_1$.

This attenuation is used to couple test signals from a signal generator to determine the receiver sensitivity of an avionics system installed in an aircraft. A mechanical structure is provided to insure the location of the pickup probe relative to the axis of the antenna of the system under test and the value of $R_1$ is adjusted to compensate for any errors of dimensions.

As an example, a pickup probe to provide an attenuation of 30 dB is desired. The probe length is 0.015, ($\lambda/20$) meters, the radial distance from the axis of the transmitting antenna is 0.03, ($\lambda/10$), meters and the operating frequency of the system under test is 1000 MHz. Therefore, the resistor to provide the precise attenuation is given by solving equation (5) as shown below:

$$\frac{P_l}{P} = \frac{1}{1000} \frac{50 \ (0.571)^2 (\lambda)^2 \left(\frac{\lambda}{20}\right)^4}{(R + 50)^2 (\lambda/10)^2} = \frac{101.53}{(R + 50)^2}$$

$$R = 268.6\Omega$$

Figure 6:
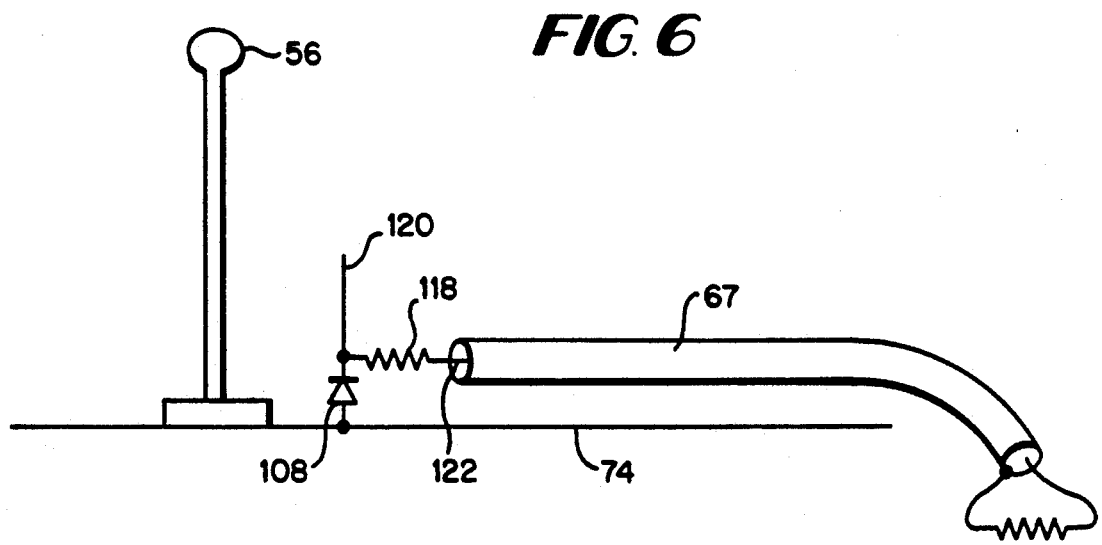
FIG. 6 is a schematic illustration of the FIG. 5 arrangement including an additional diode for rectification of received RF signals for measuring transmitted power.

To measure transmitter power, a diode 108 may be placed at the base of the pickup probe as shown in FIG. 6. The diode 108 rectifies the transmitter power and provides a pulsed or DC level to the coaxial cable 67 as shown. When the diode 108 is not conducting, the equivalent circuit of the probe is shown in FIG. 7 with the addition of the diode capacitance to the base of the pickup element. When the applied electric field is sufficiently great to cause the diode 108 to conduct, the equivalent circuit is shown in FIG. 8. The conducting diode is the voltage source and the 50 ohm load at the end of the coaxial cable is the DC return. Therefore, the pickup element can be used alternately for the injection of RF energy into the antenna under test and the production of rectified DC or pulse voltages from the transmitter radiated power.

The diode is inherently a non-linear device. However, for rectified voltages greater than about 1.4 volts, the rectified voltage represents the peak of the applied voltage.

As an example, equation 5 is solved for the voltage after rectification for a 100 watt power input to the radiating antenna.

$$E = \frac{(0.571)(0.3)(10)}{(0.03)^3} (0.015)^2 = 14 \text{ V}$$

(20 volts peak)

By including two series resistances one AC coupled, as shown in FIG. 7, the level of the rectified DC voltage from the diode can be adjusted independently from the RF voltage. Thus, for the purpose of measuring power and receiver sensitivity, both parameters may be adjusted through electrical means independently.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An RF coupler for coupling RF signals to and/or from and RF antenna substantially without shielding said antenna, said coupler including:
   a non-conductive housing capable of being mated and unmated with said RF antenna;
   an RF pickup element disposed within said housing; and
   a non-conductive conformal mounting structure at least partially disposed within said housing, said conformal mounting structure snugly enveloping said RF antenna such that said RF pickup element is disposed at a predetermined spacing and orientation relative to said antenna when said housing is mated with said antenna.

2. An RF coupler as in claim 1 wherein at least a portion of said RF antenna penetrates into said housing when said housing is mated with said antenna.

3. An RF coupler as in claim 1 wherein said conformal mounting structure includes an aperture defined through an outer surface of said housing.

4. An RF coupler as in claim 1 wherein said pickup element is spaced a predetermined distance less than one tenth of a wavelength from said antenna when said coupler is mated with said antenna.

5. An RF coupler as in claim 1 wherein said antenna emits a tangential electric field, a radial electric field and a tangential magnetic field; and said pickup element is substantially insensitive to the magnetic field and the radial electric field.

6. An RF coupler as in claim 1 further including structure within said housing defining a ground plane.

7. An RF coupler as in claim 6 further including a non-linear component within said housing, said non-linear component being electrically coupled between said pickup element and said ground plane structure.

8. An RF coupler as in claim 1 wherein said predetermined spacing relative to said antenna provides a desired attenuation for measuring characteristics of said RF antenna.

9. An RF coupler as in claim 1 wherein said RF pickup element is very short and non-resonant as compared to the operating wavelength of said antenna.

10. An RF probe assembly for easily and repeatably providing predetermined spacing and orientation of a RF pickup element relative to an antenna under test, said probe assembly comprising:
   a housing having a cavity therein, said housing having first and second walls, said first wall defining a first opening therein, said second wall defining a second opening therein, said first and second openings being at least partially in registry with one another, said first and second openings being dimensioned and positioned relative to one another such that at least a portion of said antenna passes through said first opening, into said cavity, and out of said housing cavity through said second opening;
   dielectric compressible foam disposed within said housing cavity, said foam having first and second compressible foam walls defining a slot through said foam in registry with said first and second openings, said foam walls frictionally contacting said antenna when said antenna passes through said first and second openings; and
   said RF pickup element being disposed within said housing cavity at a predetermined location and orientation relative to said first and second openings and said slot.

11. A probe assembly as in claim 10 further including a non-linear device coupled to said RF pickup element, said non-linear device rectifying RF signals received by said RF pickup element so as to provide a DC signal for facilitating measurement of RF power lever radiated by said antenna.

12. A probe assembly as in claim 10 wherein said RF pickup element is electrically short compared to the electrical length of said antenna, and is disposed less than about one tenth of a wavelength from said antenna when said antenna passes through said housing.

13. A probe assembly as in claim 10 wherein said first and second openings and said first and second foam walls together provide structure which conformally, frictionally envelopes at least a portion of said antenna.

14. A probe assembly as in claim 10 wherein said RF pickup element is substantially insensitive to magnetic and radial electric field coupling between said pickup element and said antenna.

15. A probe assembly as in claim 10 wherein said RF pickup element includes a planar two-dimensional electrically conductive radiating portion.

16. A method of measuring performance characteristics of an airborne RF transceiver of the type including an antenna protruding from the fuselage of an aircraft, said method including:
   (a) placing a probe into proximity with said antenna, said probe including a substantially non-shielding conformal mounting structure and an internal RF pickup element disposed at fixed positions relative to one another;
   (b) forcing a portion of said antenna to penetrate into said probe such that said probe conformally envelopes at least a portion of said antenna and said RF pickup element is disposed at a predetermined position and orientation relative to said antenna;
   (c) coupling RF signals between said antenna and said pickup element substantially without shielding said antenna;
   (d) measuring at least one characteristic of RF signals provided to and/or from said pickup element; and
   (e) removing said probe from said antenna.

17. A method as in claim 16 wherein said forcing step includes the step of passing said antenna through said probe via first and second openings defined by said probe.

18. A method as in claim 16 wherein said measuring step includes the step of rectifying a signal received from said antenna by said pickup element.

19. A method as in claim 16 wherein said forcing step includes the step of disposing said RF pickup element at a spacing less than one-tenth of a wavelength from said antenna.

20. A method as in claim 16 wherein:
   said forcing step (b) includes spacing said RF pickup element at a predetermined position relative to said antenna to provide a desired attenuation; and
   said measuring step (d) includes measuring characteristics of said RF antenna in accordance with said provided attenuation.

21. A method as in claim 16 wherein said RF pickup element is very short and non-resonant with respect to the operating wavelength of said antenna.

22. An RF coupler for coupling RF signals to and/or from an RF antenna, said coupler including:

a showing capable of being mated and unmated with said RF antenna;

an RF pickup element disposed within said housing; and conformal mounting structure at least partially disposed within said housing, said conformal mounting structure snugly enveloping said RF antenna such that said RF pickup element is disposed at a predetermined spacing and orientation relative to said antenna when said housing is mated with said antenna, wherein said conformal mounting structure includes a compressible dielectric foam having first and second compressible foam walls defining an aperture therethrough, said antenna penetrating into, displacing and being frictionally contacted by said first and second foam walls.

23. An RF coupled for coupling RF signals to and/or from an RF antenna, said coupler including:

a showing capable of being mated and unmated with said RF antenna;

an RF pickup element disposed within said housing; and conformal mounting structure at least partially disposed within said housing, said conformal mounting structure snugly enveloping said RF antenna such that said RF pickup element is disposed at a predetermined spacing and orientation relative to said antenna when said housing is mated with said antenna, wherein said conformal mounting structure includes first and second slots defined by said housing, said first and second slots being disposed in at least partial registry with one another, said antenna penetrating said housing through said first slot and exiting said housing through said second slot when said housing is mated with said antenna.

24. A method of measuring performance characteristics of an airborne RF transceiver of the type including an antenna protruding from the fuselage of an aircraft, said method including:

(a) placing a probe into proximity with said antenna, said probe including conformal mounting structure and an internal RF pickup element disposed at fixed positions relative to one another;

(b) forcing a portion of said antenna to penetrate into said probe such that said probe conformally envelopes at least a portion of said antenna and said RF pickup element is disposed at a predetermined position and orientation relative to said antenna;

(c) coupling RF signals between said antenna and said pickup element;

(d) measuring at least one characteristic of RF signals provided to and/or from said pickup element; and (e) removing said probe from said antenna, wherein said forcing step includes the step of frictionally contacting said antenna with at least one dielectric foam wall disposed within said probe so as to compress said foam wall against said antenna.

* * * * *